United States Patent
Fukunari

(10) Patent No.: US 7,194,332 B2
(45) Date of Patent: Mar. 20, 2007

(54) DATA BASED NODE PENALTIES

(75) Inventor: Miki Fukunari, Lowell, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 1216 days.

(21) Appl. No.: 10/147,127

(22) Filed: May 16, 2002

(65) Prior Publication Data

US 2003/0214911 A1    Nov. 20, 2003

(51) Int. Cl.
G06F 7/00    (2006.01)
(52) U.S. Cl. .................. 700/228; 700/112; 700/113
(58) Field of Classification Search ............... 700/228, 700/28, 112, 113, 213, 229
See application file for complete search history.

(56) References Cited

U.S. PATENT DOCUMENTS

| | | | | |
|---|---|---|---|---|
| 5,341,130 | A * | 8/1994 | Yardley et al. | 340/3.1 |
| 6,285,951 | B1 * | 9/2001 | Gaskins et al. | 701/209 |
| 6,647,316 | B2 * | 11/2003 | Bahri et al. | 700/217 |
| 6,687,568 | B2 * | 2/2004 | Ohtsuka et al. | 700/213 |
| 2002/0138172 | A1 * | 9/2002 | Bahri et al. | 700/217 |
| 2002/0161618 | A1 * | 10/2002 | Weiss et al. | 705/8 |
| 2004/0254674 | A1 * | 12/2004 | Nojo et al. | 700/213 |

* cited by examiner

Primary Examiner—Khoi H. Tran
(74) Attorney, Agent, or Firm—Weingarten, Schurgin, Gagnebin & Lebovici LLP; Richard Pickreign

(57) ABSTRACT

A method for determining a node based penalty for use in a path finding algorithm for an automated material handling system (AMHS) is described. The AMHS includes a track interconnecting a plurality of nodes, and on which a plurality of material transport vehicles (MTVs) move. In particular, each of the nodes and MTVs provide queue-blocking data that is stored in a queue-blocking database along with a time tag indicating the time the data was collected. The AMHS retrieves data from the queue-blocking database that has a time tag within a predetermined time window and determines a queue blocking metric for each node in the material transport system. The queue blocking time is converted from to a node based penalty that is the additional distance that an MTV would travel while blocked. Thus, the node based penalty distance is added to the physical distance between a pair of nodes to provide a distance metric indicative of the current traffic conditions. The AMHS receives a source node and a destination node from a material control system and determines all possible routes between the two nodes. The distance metric for each route is computed and the AMHS selects the route having the shortest distance metric.

8 Claims, 3 Drawing Sheets

DATA BASED NODE PENALTIES

CROSS REFERENCE TO RELATED APPLICATIONS

N/A

STATEMENT REGARDING FEDERALLY SAPONSORED RESEARCH OR DEVELOPMENT

N/A

BACKGROUND OF THE INVENTION

This invention relates generally to a material control system in a network-like, vehicle-based, material handling system and in particular to a method for determining a node based penalty for use in a path finding algorithm for an automated material handling system (AMHS).

Electrically powered motor transport vehicles (MTVs) are used in manufacturing and warehouse environments for transporting and manipulating articles of manufacture. Such vehicles are desirable in these environments due to their clean operation and low noise. Often, such vehicles are propelled along a fixed rail or track, allowing precise control of movement along a predetermined path.

In particular, computer controlled materials transport systems are known for moving materials, such as semiconductor wafers, among various workstations of a semiconductor fabrication facility. In such a wafer transport system, a monorail track is routed past the work stations and a plurality of electric vehicles are mounted on the track and moveable thereon for delivering wafers to successive work stations and for removing wafers therefrom after requisite processing operations have been accomplished. The track is composed of interconnected track sections that usually include one or more routing sections or modules that are operative to provide plural paths along the track. In general, a node is a location where a vehicle is stopped, loaded, unloaded, or redirected. Thus, a node can be a workstation that a vehicle must pass through or an intersection of one or more tracks where the vehicle may be redirected.

The vehicles on the track typically operate in a connected mode in which a central controller, usually a computer, assigns destinations to vehicles and monitors the operation of the entire material handling system. This monitoring may include monitoring the status and location of each MTV, the status and location of material lots needed to be transported, and the status of each node of the material transport system.

The central controller is therefore responsible for the execution of move requests to transport a material lot from a source node to a destination node. In addition, the central controller is also responsible for the overall efficiency of the material transport system. For example, the more efficient use of the MTVs results in needing fewer of them, which reduces the cost of the overall system. In addition, by selecting routes to avoid "traffic jams" at busy nodes, the central controller may avoid a number of MTVs waiting in a queue for a pick-up or a delivery of a material lot. While waiting in a queue, the MTV is being used inefficiently and the material transport system will experience longer delivery times.

In selecting a route, the central controller use an algorithm that not only takes into account the distance between the source and destination nodes, but also takes into account the block time at the intermediate nodes. Typically, the penalty block time at the various nodes is a predetermined linear-time-invariant penalty that is merely a constant multiplied by the number of MTVs in the input queue. However, an important consideration in semiconductor fabrication facilities is the quick transition of material between the source and the destination. Vehicles tend to cluster around busy nodes at certain production times because of lot batching and frequent move requests at one specific node. Semiconductor manufacturing is by nature a stochastic process and linear-time-invariant node penalties are not flexible enough to allow the proper optimized route setting. In particular, linear-time-invariant node penalties are adequate for AMHS systems that experience insignificant congestion. However, these penalties are inadequate for systems that experience heavy congestion, and in particular systems that experience heavy congestion aggravated by an AMHS layout that is not flexible enough to handle a large number of moves in the same area within a short period of time.

What is needed, therefore, is a routing algorithm that will allow an AMHS or MTC to select an optimum route on the basis of dynamic node penalties.

BRIEF SUMMARY OF THE INVENTION

A method for determining a node based penalty for use in a path finding algorithm for an automated material handling system (AMHS) is described. The AMHS includes a track interconnecting a plurality of nodes, and on which a plurality of material transport vehicles (MTVs) move. In particular, each of the nodes and MTVs provide queue-blocking data that is stored in a queue-blocking database along with a time tag indicating the time the data was collected. The AMHS retrieves data from the queue-blocking database that has a time tag within a predetermined time window and determines a queue blocking metric for each node in the material transport system. The queue blocking time is converted from to a node based penalty that is the additional distance that an MTV would travel while blocked. Thus, the node based penalty distance is added to the physical distance between a pair of nodes to provide a distance metric indicative of the current traffic conditions. The AMHS receives a source node and a destination node from a material control system and determines all possible routes between the two nodes. The distance metric for each route is computed and the AMHS selects the route having the shortest distance metric.

In one embodiment, a method of selecting a route from a source node to a destination node from among a plurality of routes is disclosed. Each route consists of a route in which one or more intermediate nodes are used to connect the source node to the destination node. In the method queue blocking data is received from each of the plurality of nodes and is stored in a database along with time data indicative of the time the data was collected. The queue blocking data stored in the database is selected according to a predetermined period of time, such that a moving window having a predetermined width is used to select the queue blocking data of interest. The average of the windowed queue blocking data for each of the plurality of nodes is calculated. The average value of the queue blocking data for each of the plurality of nodes is converted into a node penalty distance. For each route, the total distance of the route, including all the node penalty distances corresponding to the nodes in the respective route, is computed.

In one embodiment, the distance between the source node and the destination node is calculated as:

$$Dist(Node_{Source}, Node_{Dest}) = \sum_{i=2}^{M} (Dist(i-1, i) + Node\_Penalty(i) * (MTV_{queue} + 1)).$$

In one embodiment, the node penalty is calculated as:

$$Node\_Penalty_j = \frac{1}{K} * \left(\sum_{k=1}^{K} Q_{j,k}\right) * C,$$

where K is the total number of data contained in the current time window, $Q_{j,k}$ is the $k^{th}$ queue blocking data where k=1,2,3, . . . K for node j and C is the conversion factor between time and distance.

Other forms, features, and aspects of the above-described methods and system are described in the detailed description that follows.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
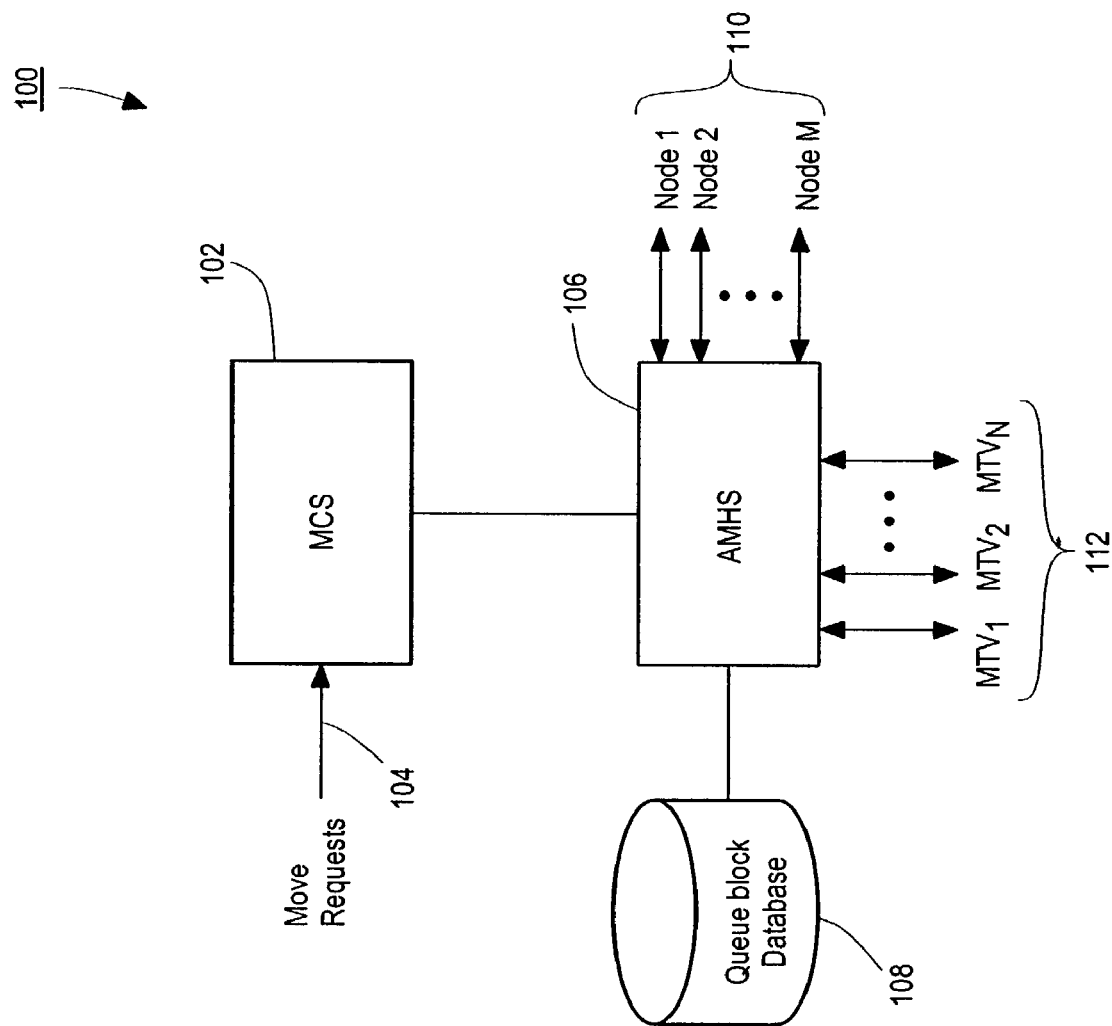
FIG. 1 is a block diagram of a controller for a material transport system.

FIG. 1 depicts a block diagram of material transport system control system that selects an optimal route for a material transport vehicles (MTVs) between a source node and a destination node. The material transport control system includes a material control system (MCS) 102 that receives material move requests 104 and provides source and destination nodes to the automated material handling system (AMHS) 106. The AMHS 106 receives data from a plurality of nodes 110 regarding the status of each of the plurality of nodes and further receives data from each of a plurality of MTVs 112 regarding the location and status of each of the MTVs. For the purposes of the node based penalty system described herein, the AMHS 106 receives queue-blocking data from each node and MTV. The queue-blocking data includes the time necessary for an MTV to travel from an input station to an output station of a node and the time waiting the MTV needed to wait for an output segment to clear.

Figure 2:
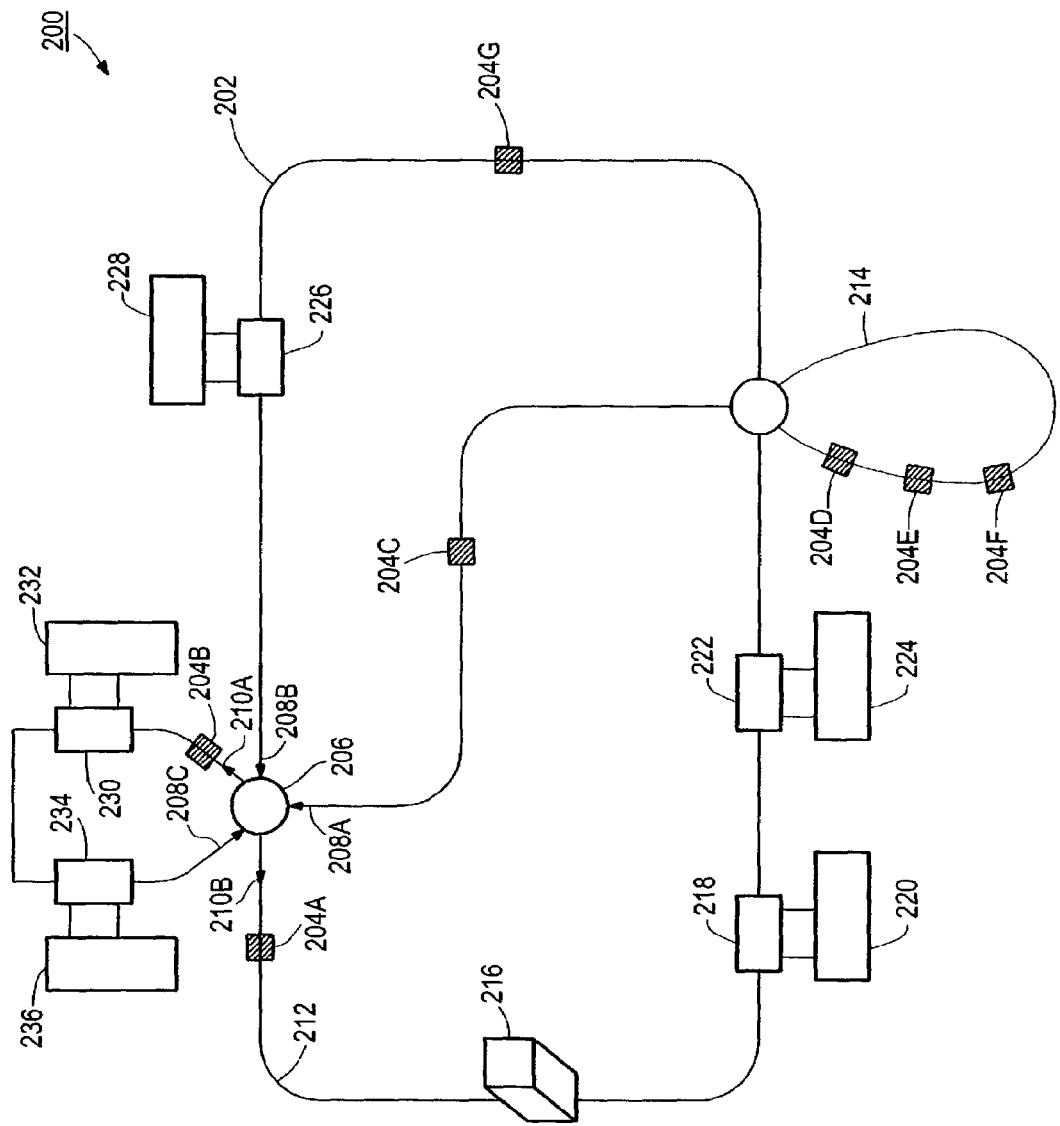
FIG. 2 is a schematic representation of a material transport system.

FIG. 2 depicts a simplified schematic of a material transport system 200 that includes a track section 202 on which a plurality of MTVs 204A–G move between a plurality of nodes 220, 224, 228, 236, and 232. The track section can also include a vertical transfer node 216 for moving a MTV between tracks on different levels. The track section also includes horizontal transfer nodes 218, 222, 226, 230, and 234 that move an MTV from the track 202 to nodes 220, 224, 228, 236, and 232 respectively. A typical node 206 includes input stations 208A–C at which an MTV can enter the node, and output stations 210A–B at which a MTV can exit the node. An output segment 212 is the portion of the track 202 that is connected to one of the exit stations. In general, only one MTV is allowed on a node including a track segment between an input and an output station at a given time. Accordingly, as discussed above, the queue blocking data for each node includes not only the time to travel between an input station and an output station, but also the time necessary to wait for an open output segment 212.

Referring again to FIG. 1, each node and each MTV provides various data to the AMHS. For the purposes of the node-based penalty system described herein, the AMHS 106 stores the queue blocking data in queue blocking database 108. The queue blocking-data is stored along with a time tag indicating the time at which the data was generated by one of the plurality of nodes 110 and/or MTVs 112.

Figure 3:
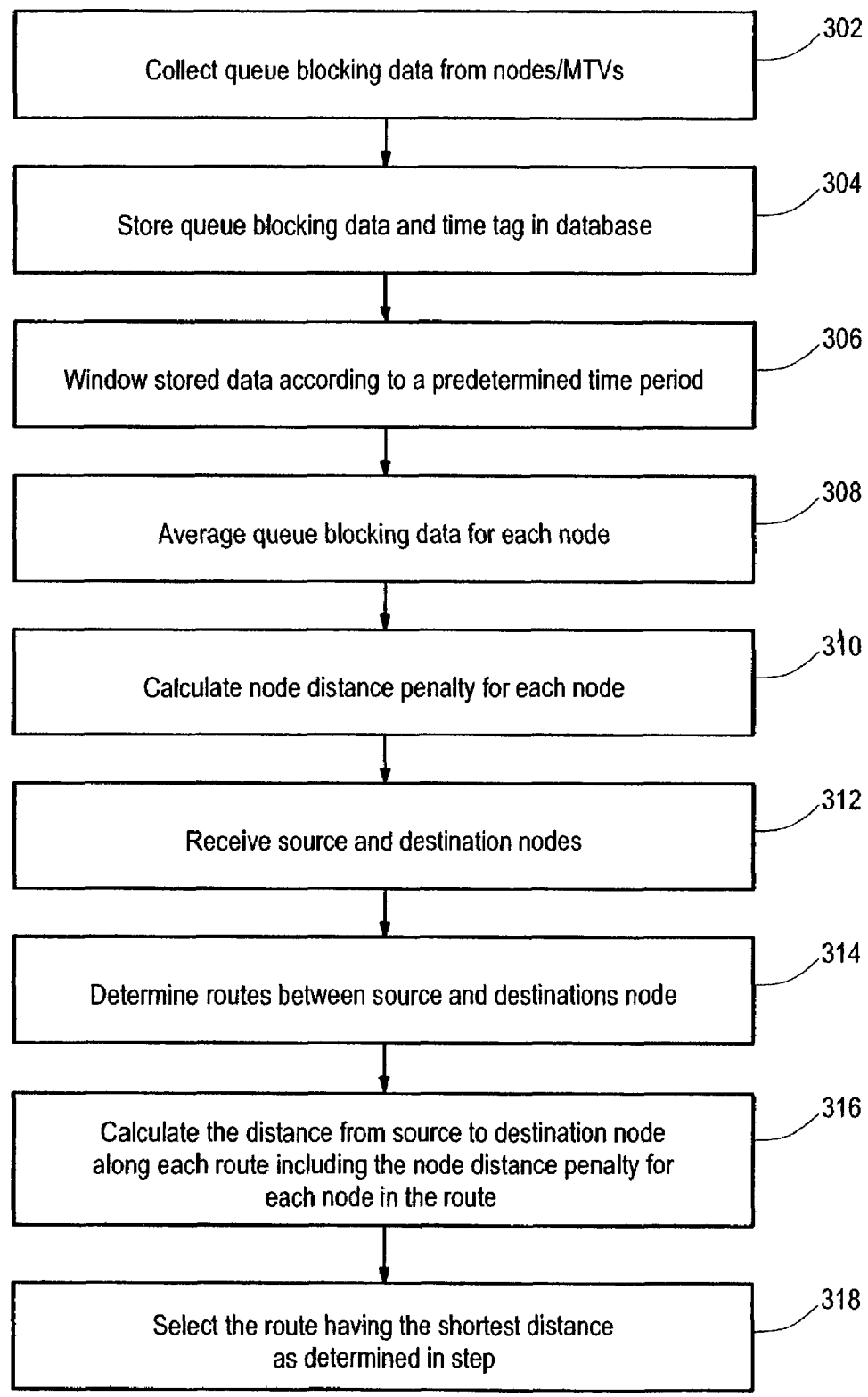
FIG. 3 is a flowchart depicting a method for determining node based penalties based on windowed data stored in a node database and further for finding an optimal route based on the determined node penalty data.

The AMHS 106 dynamically determines a node penalty for each node in the MTS based on the data stored in queue-blocking database 108. The AMHS 106 uses this data to determine an optimal route between the source node and a destination node provided by the MCS 102. As will be discussed in more detail below, FIG. 3 depicts a method of determining the node penalty for each node in the MTS and for finding an optimal route between a source node and a destination node.

The AMHS 106 collects queue blocking data for each node and MTV and stores this data in the queue-blocking database 108 along with a time tag indicating the time the data was collected, as depicted in steps 302 and 304. As discussed above, the queue blocking data is the sum of the expected time to wait for an open output segment and the time to traverse the node between an input station and an output station. The stochastic nature of the queue blocking data limits the time for which the data is useful in determining the current status of a node and MTV. Accordingly, only queue-blocking data stored in the queue-blocking database 108 that has a time tag within a predetermined time window is used in the node penalty calculation. In this way, the node penalty associated with each node is updated periodically with recent data. In the preferred embodiment, the predetermined time window is shifted every 10 minutes to include only the most recent 10 minutes of queue blocking data.

The windowed data for each node is averaged and an average value associated with each node is stored in the queue-blocking database, as depicted in step 308. The averaging can be a straight arithmetic average or a weighted-average can be used. Alternatively, various digital-filtering algorithms may be used to remove data artifacts or to smooth otherwise rapidly changing data. The selection of the particular algorithm to manipulate the windowed data is a function of the overall system requirements and can be selected based on the empirical data. A node penalty that is a function of the average queue-blocking value associated with the respective node is determined as depicted in step 310. In the preferred embodiment, the node penalty for a particular node is the average queue-blocking value associated with the respective node converted into a distance representing the equivalent distance that the MTV would travel due to the time delay. In a preferred embodiment in which the MTVs travel at 1.833 feet/second, the node penalty is equal to the average value of the queue-blocking data associated with the node multiplied by 1.8333, as depicted in step 310.

Once each node has a node penalty associated with it, an optimal route may be determined for an MTV travelling between a given source and destination node. As discussed above, the MCS 102 provides a source node and a destination node to the AMHS 106, and the AMHS 106, as depicted in step 312, determines the possible routes between the source and destination nodes, as depicted in step 314, and evaluates the possible routes, as depicted in step 316 to determine the route that will take the least amount of time to traverse. In the preferred embodiment, the node penalties are equivalent to the increase in distance the MTV would travel due to the queue-blocking time at the associated node. Accordingly, in a preferred embodiment, the AMHS 106 determines the distance between the source node and the destination along each of the existing routes and includes the node penalty distance for each intermediate node on the route. The AMHS then selects the route having the smallest distance. In particular the AMHS 106 identifies each of the routes, $R_i$, where i=1,2,3, . . . ,n, wherein each route has nodes $N_{i,j}$, where j=1,2,3, . . . m. Thus, the distance for each route is computed as:

$$Dist(R_i) = \sum_{j=1}^{m} (\text{Length}(\text{Node}_{i,i}, \text{Node}_{i,j+1}) + (\text{Node\_Penalty}(j) * (\text{Queue}_j + 1)))$$

where Length($\text{Node}_{i,j}$,$\text{Node}_{i,j+1}$) is the length of the track between the $j^{th}$ node and the $j^{th}$+1 node in the $i^{th}$ route and m is the number of nodes between the source node and the destination node. The Node_Penalty (j) is the node penalty associated with $j^{th}$ node, and the $Queue_j$ is the length of the MTV queue at node j. As discussed above, the Node_Penalty is computed as:

$$\text{Node\_Penalty}_j = \frac{1}{K} * \left(\sum_{k=1}^{K} Q_{j,k}\right) * C$$

where K is the total number of data contained in the current time window, $Q_{j,k}$ is the $k^{th}$ queue blocking data where k=1,2,3, . . . K for node j and C is the conversion factor between time and distance, which is 1.8333 (the speed of the MTV in feet per second) in the preferred embodiment. The AMHS 106 evaluates the distance that is calculated for each route between the source node and the destination node and selects the route having the least distance metric as determined above, as depicted in step 318. The AMHS determines the optimal route at least once prior to the selected MTV beginning to travel and may be updated at one or more intermediate nodes during the time that the MTV is traversing the selected route. This allows the route to be updated with new information based on newly received queue-blocking data if desired.

Those of ordinary skill in the art should further appreciate that variations to and modification of the above-described methods for calculating node based penalties and optimal route selection can be made. Accordingly, the invention should be viewed as limited solely by the scope and spirit of the appended claims.

What is claimed is:

1. A method for determining a node based penalty in a material transport system having a plurality of interconnected nodes, the method comprising the steps of:
   providing a plurality of data from the plurality of nodes indicative of the queue blocking time of the corresponding node;
   windowing the plurality of data over a predetermined time period; and
   determining a node penalty metric indicative of the queue blocking time during the window period for each of the plurality of nodes having windowed data associated therewith.

2. The method of claim 1 wherein the step of determining the node penalty metric indicative of the queue blocking time includes determining the average queue blocking time.

3. The method of claim 1 wherein the step of determining the node penalty metric indicative of the queue blocking time includes converting queue blocking time into a node penalty distance.

4. The method of claim 1 wherein the step of providing a plurality of data from the plurality of nodes indicative of the queue blocking time of the corresponding node includes receiving from each of the plurality nodes storing queue blocking data to a database along with time data indicative of the time the data was taken.

5. The method of claim 4 wherein the step of windowing the plurality of data over a predetermined time period includes selecting from the plurality of queue blocking data stored in the database having time data within the predetermined window time period.

6. A method of selecting a route from a source node to a destination node from among a plurality of identified routes, each route including one or more intermediate nodes connecting the source node and the destination node, the method comprising:
   receiving from each of the plurality nodes queue blocking data;
   storing the received queue blocking data associated with each of the plurality of nodes in a database along with time data indicative of the time the data was collected;
   selecting from the plurality of queue blocking data stored in the database having time data within a predetermined window time period;
   determining the average queue blocking time for each of the plurality of nodes;
   converting the queue blocking time into a node penalty distance;
   determining for each of the plurality of routes the distance between the source node and the destination node as a function of the actual distance to be traveled and the node penalty distance associated with each intermediate node in each of the plurality of routes.

7. The method of claim 6 wherein the step of determining for each of the plurality of routes the distance between the source node and the destination node includes calculating the distance between the source node and the destination node according to $$Dist(\text{Node}_{Source}, \text{Node}_{Dest}) = \sum_{i=2}^{M} (Dist(i-1, i) + \text{Node\_Penalty}(i) * (MTV_{queue} + 1)).$$

8. The method of claim 7 wherein the Node_Penalty(j) is $$\frac{1}{K} * K\left(\sum_{k=1}^{} Qj,k\right) * C,$$

where K is the total number of data contained in the current time window, $Q_{j,k}$ is the $k^{th}$ queue blocking data where k=1,2,3, . . . K for node j and C is the conversion factor between time and distance.

* * * * *